United States Patent [19]

Herrick

[11] Patent Number: 4,965,514
[45] Date of Patent: Oct. 23, 1990

[54] APPARATUS FOR PROBING A MICROWAVE CIRCUIT

[75] Inventor: Geoffrey C. Herrick, Portland, Oreg.

[73] Assignee: Tektronix, Inc., Beaverton, Oreg.

[21] Appl. No.: 363,027

[22] Filed: Jun. 5, 1989

[51] Int. Cl.⁵ .............................................. G01R 31/02
[52] U.S. Cl. ............................ 324/158 P; 324/158 F;
[58] Field of Search .......... 324/73 AT, 158 F, 158 P, 324/73 PC; 333/246

[56] References Cited

U.S. PATENT DOCUMENTS

| | | | |
|---|---|---|---|
| 4,365,195 | 12/1982 | Stegens | 324/158 F |
| 4,697,143 | 9/1987 | Lockwood et al. | 324/158 F |
| 4,749,942 | 6/1988 | Sang et al. | 324/158 P |
| 4,764,723 | 8/1988 | Strid | 324/158 F |
| 4,853,627 | 8/1989 | Gleason et al. | 324/158 P |

FOREIGN PATENT DOCUMENTS

WO8606195  11/1986  PCT Int'l Appl. .

Primary Examiner—Ernest F. Karlsen
Assistant Examiner—Vinh P. Nguyen
Attorney, Agent, or Firm—John D. Winkelman; John Smith-Hill

[57] ABSTRACT

Apparatus suitable for on-wafer probing of microwave integrated circuits includes a coplanar waveguide carried on one surface of an elongate, tapered, dielectric substrate. The waveguide includes a signal conductor extending substantially the length of the substrate and a pair of ground conductors extending along the opposite edges of the signal conductor. The substrate is bonded to a metal mounting block adjacent one end of an coaxial electrical connector. Conductive bonding material, suitably a conductive epoxy material, is applied along the outer edges of the ground conductors to establish a low impedance ground path between the coaxial waveguide and the metal block.

4 Claims, 1 Drawing Sheet

APPARATUS FOR PROBING A MICROWAVE CIRCUIT

BACKGROUND OF THE INVENTION

This invention relates to apparatus for probing a microwave circuit.

A known form of apparatus for probing a microwave integrated circuit comprises a dielectric substrate, a coplanar waveguide on a first main surface of the substrate, and a mounting structure to which the substrate is attached. The substrate has an end region that is shaped to permit the end region to be brought into close proximity with an integrated circuit under test, and an opposite edge. The coplanar waveguide comprises a signal conductor extending from the aforesaid edge of the substrate to the end region and two ground conductors extending adjacent the signal conductor along opposite respective edges thereof. At the end region, the signal conductor and the two ground conductors are connected to respective contact bumps. The mounting structure comprises a block of metal having a generally planar surface region to which the substrate is adhesively bonded. Conductive bonding material extends along the aforesaid edge of the substrate and provides electrically conductive connection between the metal block and the ground conductors. The metal block is formed with a bore that opens at the generally planar surface region. A conductive pin extends within the bore, and dielectric material is disposed within the bore and separates the pin from the metal block. The pin and the metal block are connected respectively to the core conductor and the outer conductor of a coaxial waveguide. The pin is connected to the signal conductor of the coplanar waveguide.

This type of probing apparatus is used for probing microwave integrated circuits in wafer form, by positioning the apparatus so that the contact bumps at the end region of the substrate contact respective pads of a circuit under test. The metal block must be quite large in order to allow it to be mounted in a stable fashion. This implies that when multiple contact pads are to be probed simultaneously, so that multiple metal blocks are distributed around the circuit under test, the blocks must be at a substantial distance from the circuit under test. This in turn implies that the length of a substrate, from the edge at which contact is made to the ground conductors to the end region at which the contact bumps are located, is substantial and therefore the length of the ground conductors must be substantial.

The coplanar waveguide and the coaxial waveguide each have a uniform characteristic impedance. The connections between the conductors (both signal and ground) are designed to provide a smooth transition between the two waveguide configurations. For example, the size of the bore in metal block and the dielectric constant of the dielectric material are selected to provide a capacitance between the pin and the metal block sufficient to compensate the inductance of the portion of the pin that projects beyond the planar surface region of the metal block.

The conductive bonding material that connects the metal block to the ground conductors of the coplanar waveguide interposes a finite impedance between the metal block, which is a hard ground, and the ground conductors of the coplanar waveguide. This impedance in the ground path causes delay in propagation of the signal from the contact bumps to the coaxial waveguide, resulting in signal distortion.

The ground conductors of the coaxial waveguide have a finite inductance. It is desirable that the inductance of the ground path between the contact bumps and the metal block be minimized, in order to enable the lumped capacitance that must be provided to compensate for the inductance of the ground path to be minimized. Moreover, it is desirable that losses of RF energy be minimized. Since a major source of losses is attributable to the skin effect in the ground conductors of the coplanar waveguide, and the losses due to the skin effect are a function of the length of the ground conductors, it is desirable that the length of the ground conductors be minimized. The need to reduce the length of the ground conductors is in conflict with the ability to probe multiple contact pads of a circuit simultaneously.

SUMMARY OF THE INVENTION

In accordance with the present invention, apparatus for probing a microwave circuit comprises a dielectric substrate having first and second opposite main surfaces, the substrate having a first edge, an end region opposite the first edge, and second and third edges extending from opposite respective ends of the first edge towards the end region. A coplanar waveguide is provided on the first main surface of the substrate and comprises a signal conductor extending from the first edge of the substrate to the end region thereof and first and second ground conductors extending adjacent the signal conductor along opposite respective edges thereof. A mounting structure for the substrate comprises a block of conductive material having a generally planar surface region. The substrate is attached to the mounting structure with the generally planar mounting region of the mounting structure in confronting relationship with the second main surface of the substrate. The block of conductive material is formed with a bore that opens at the generally planar surface region. A core conductor extends within the bore in the block of conductive material and is connected to the signal conductor, and dielectric material is provided within the bore and separates the core conductor from the block of conductive material. Conductive means connect the ground conductors of the coplanar waveguide to the block of conductive material over a substantial portion of the length of the second and third edges of the substrate from the first edge towards the end region.

BRIEF DESCRIPTION OF THE DRAWINGS

For a better understanding of the invention, and to show how the same may be carried into effect, reference will now be made, by way of example, to accompanying drawings in which.

DETAILED DESCRIPTION

Figure 1:
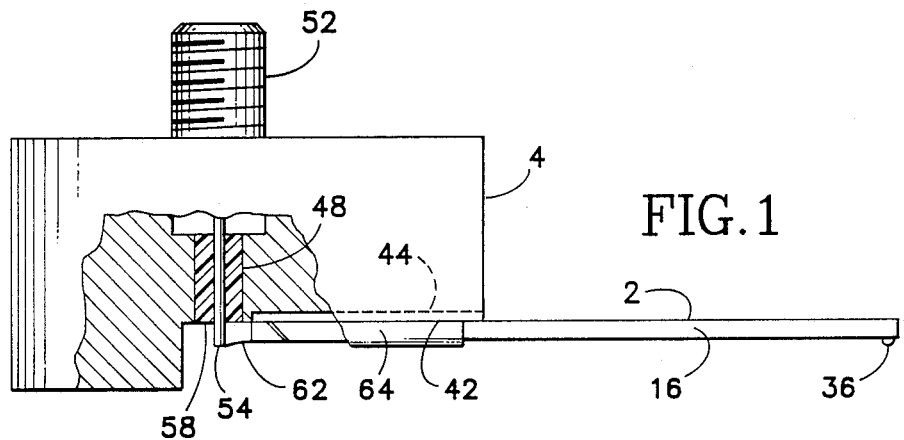
FIG. 1 is a side view, partly broken away, of probe apparatus embodying the present invention.
Figure 2:
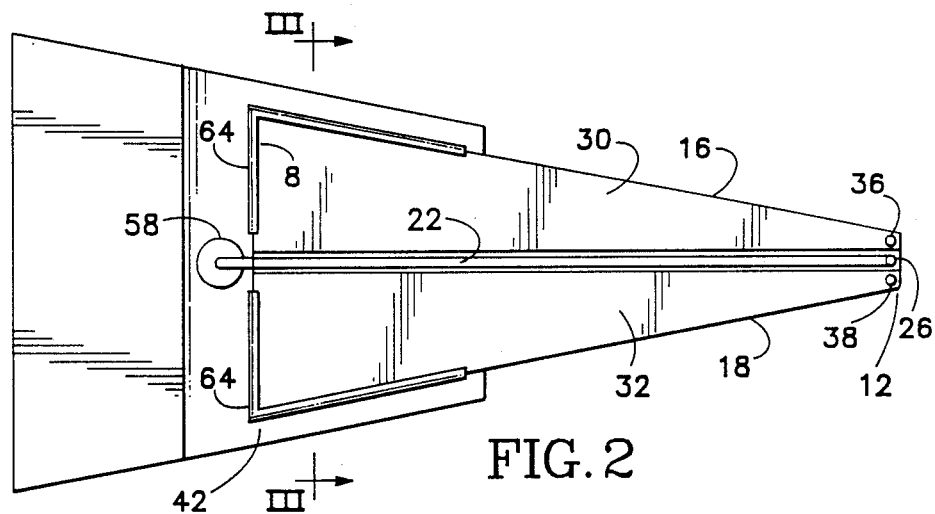
FIG. 2 is a bottom plan view of the apparatus.
Figure 3:
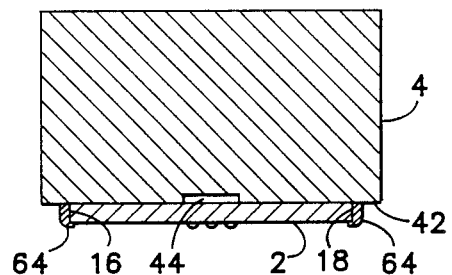
FIG. 3 is a sectional view taken on the line III—III of FIG. 2.

The apparatus shown in the drawings comprises a ceramic substrate 2 mounted on a metal mounting block 4. The substrate 2 is substantially triangular, having a base edge 8, an opposite tip region 12, and two side edges 16, 18 extending between base edge 8 and tip region 12. The substrate is continuous within the boundary defined by base edge 8, side edges 16, 18 and the edge at tip region 12, i.e. it is not formed with any openings within that boundary. Such openings can adversely affect the mechanical properties of a ceramic substrate and are therefore to be avoided. A coplanar waveguide is formed on the lower surface of the substrate. The coplanar waveguide comprises a signal conductor 22 that extends from the center of base edge 8 to a contact bump 26 at tip region 12, and two ground conductors 30, 32, which extend adjacent signal conductor 22 from base edge 8 to contact bumps 36, 38 adjacent contact bump 26.

Bond wires (not shown) are connected between ground conductors 30, 32 in order to ensure that contact bumps 36, 38 are at the same potential.

Mounting block 4 has a lower surface 42 that is trapezoidal in bottom plan view and is generally planar except for a trench 44, the purpose of which will be explained below. Substrate 2 is adhesively bonded to mounting block 4, with the upper surface of substrate 2 in parallel confronting relationship with surface 42. Mounting block 4 is formed with a cylindrical bore 48, which is perpendicular to surface 42 and opens at surface 42. Bore 48 is internally threaded at its upper end, and receives an externally threaded coaxial cable connector 52. Disposed coaxially in bore 48 is a conductive pin 54. Pin 54 is separated from the interior surface of bore 48 by dielectric material 58. Signal conductor 22 is connected to pin 54 by a gold ribbon 62.

The bonding agent that is used to bond substrate 2 to block 4 is a conductive epoxy material, and bonding agent 64 is applied along edges 8, 16 and 18 of substrate 2 so as to provide electrically conductive connection between ground conductors 30, 32 and block 4. In the illustrated embodiment of the invention, this results in the location of the closest point at which ground conductors 30, 32 are connected to block 4 being only about two-thirds of the distance from tip region 12 to edge 8.

By providing connections between ground conductors 30, 32 and block 4 along edges 16, 18 of substrate 2, the inductance of the connection between contact bumps 36, 38 and mounting block 4 is reduced as compared with the probing apparatus in which the only connection is at the base edge of the substrate and so the size of the capacitance needed to compensate for the inductance of the ground path is reduced. Also, the length of the ground path is reduced as compared to the prior apparatus, and accordingly the losses of RF energy are reduced. Further, a more ready transition from the coplanar configuration to the coaxial configuration is provided.

The trench 44 ensures that a coplanar waveguide configuration is provided over the length of the signal conductor, rather than a grounded coplanar configuration over part of its length and an ungrounded coplanar configuration over the rest of its length. It is desirable to avoid the latter arrangement since it involves two transitions in configuration of the waveguide.

It will be appreciated that the invention is not restricted to the particular embodiment that has been described and illustrated, and that variations may be made therein without departing from the scope of the invention as defined in the appended claims and equivalents thereof. For example, the invention is not limited to use of conductive epoxy to bond substrate 2 to mounting block 4. A dielectric epoxy could be used as bonding agent, so long as conductive material is provided along edges 8, 16, 18 for connecting ground conductors 30, 32 to mounting block 4.

I claim:

1. Apparatus for probing a microwave circuit, comprising:

a dielectric substrate having first and second opposite main surfaces, the substrate having a first edge, an end region opposite the first edge, and second and third edges extending from opposite respective ends of the first edge towards said end region, a coplanar waveguide on the first main surface of the substrate, the coplanar waveguide comprising a signal conductor extending from the first edge of the substrate to the end region thereof and first and second ground conductors extending adjacent the signal conductor along opposite respective edges thereof, a mounting structure comprising a block of conductive material having a generally planar surface region, the substrate being attached to the mounting structure with the generally planar surface region of the mounting structure in confronting relationship with the second main surface of the substrate, the block of conductive material being formed with a bore that opens at the generally planar surface region, a core conductor extending within the bore and connected to the signal conductor, dielectric material within the bore and separating the core conductor from the block of conductor material, and conductive means connecting the ground conductors to the block of conductive material over a substantial portion of the length of the second and third edges of the substrate from the first edge towards said end region.

2. Apparatus according to claim 1, wherein the conductive means comprise conductive bonding material in adhesive relationship with the ground conductors and the mounting block over a substantial part of the length of the second and third edges of the substrate.

3. Apparatus according to claim 1, wherein the dielectric substrate is generally triangular and the end region is an apex region of the substrate.

4. Apparatus according to claim 1, comprising conductive bonding material attaching the substrate to the mounting structure.

* * * * *